United States Patent [19]

Sheppard

[11] 4,388,702

[45] Jun. 14, 1983

[54] MULTI-BIT READ ONLY MEMORY CIRCUIT

[75] Inventor: Douglas P. Sheppard, Grapevine, Tex.

[73] Assignee: Mostek Corporation, Carrollton, Tex.

[21] Appl. No.: 294,831

[22] Filed: Aug. 21, 1981

[51] Int. Cl.³ .............................................. G11C 17/00
[52] U.S. Cl. ...................................................... 365/104
[58] Field of Search ............................ 365/45, 104, 168

[56] References Cited

U.S. PATENT DOCUMENTS

| 4,192,014 | 3/1980 | Craycraft | 365/104 |
|---|---|---|---|
| 4,287,570 | 9/1981 | Stark | 365/104 |
| 4,327,424 | 4/1982 | Wu | 365/104 |
| 4,342,102 | 7/1982 | Puar | 365/104 |

FOREIGN PATENT DOCUMENTS

| 35646 | 9/1981 | European Pat. Off. | 365/104 |
|---|---|---|---|
| 54-158134 | 12/1979 | Japan | 365/104 |
| 54-161853 | 12/1979 | Japan | 365/104 |

OTHER PUBLICATIONS

*Electronics*, vol. 55, No. 5, pp. 81–82, Jun. 30, 1982, "Four-State Cell Called Density Key", R. Lineback.

Primary Examiner—George G. Stellar

[57] ABSTRACT

A ROM circuit (10) includes a plurality of multi-bit memory storage transistors (22, 24, 26, 28, 29) and reference transistors (40, 42 and 44) all connected along a word line (16). Each of the storage transistors is provided with bit (18) and column (20) lines for activating a specific memory storage transistor and transmitting the data state thereof to sensing circuitry. A step control signal is transmitted through a control line (80) and applied to a selected one of the memory storage transistors and to each of the reference transistors (40, 42 and 44) on a selected word line (16). The step control signal is sequentially decreased in voltage to apply a progressively increasing gate-to-source voltage to each of the reference transistors (40, 42 and 44) and to a selected one of the memory storage transistors (26). The reference transistors (40, 42, and 44) are sequentially turned on by the increasing gate-to-source bias generated by the step control signal. The steps of the step control signal are generated in response to the turn on of the reference transistors (40, 42 and 44). The selected memory storage transistor (26) is turned on when the gate-to-source voltage of the transistor (26) is reached. At the time that the memory storage transistor (26) is turned on the condition of the reference transistors (40, 42 and 44) is latched to determine the voltage threshold level of the selected memory storage transistor (26). The latched conditions of the reference transistors (40, 42 and 44) are then decoded to produce the appropriate output signals corresponding to the data state fabricated into the selected memory storage transistor (26).

22 Claims, 9 Drawing Figures

MULTI-BIT READ ONLY MEMORY CIRCUIT

TECHNICAL FIELD

This invention relates to semiconductor memories, and more particularly to a multi-bit read only memory circuit.

RELATED APPLICATION

This application includes similar subject matter to copending U.S. application Ser. No. 295,144 filed Aug. 21, 1981 which is assigned to the assignee of the present application.

BACKGROUND ART

Large scale integration techniques have brought about the construction of large arrays of binary storage elements on a single chip of silicon. These storage cells, typically using MOS technology, consist of multi-component circuits in a conventional bistable configuration. There are numerous advantages of such semiconductor storage devices including high packing density and low power requirements of such memory cells.

With the advancement of semiconductor technology, there has been a need to increase the number of data bits stored per unit area on the semiconductor chip. The increased storage capacity decreases the cost of manufacture of a semiconductor memory. In the course of the evolution of the semiconductor industry, the technique of ion implantation into the channel region of a field-effect transistor device has been developed to adjust the threshold voltage for the device so that the gate voltage at which the device will switch can be customized. With the use of ion implantation, memory cells have been developed which utilize field-effect transistors having different threshold voltages for multi-bit data storage. These field-effect transistors require sensing circuitry for determining the threshold voltage for each memory cells. Multi-bit field-effect transistors and one such sensing scheme is described in U.S. Pat. No. 4,202,044 issued to Beilstein, Jr. et al on May 6, 1980 and entitled "Quaternary FET Read Only Memory".

A need has thus arisen for a multi-bit read only memory circuit for use with read only memory storage devices utilizing multi-level ion implantation to set multi-level threshold voltage levels in the storage devices. Such a circuit must be simple in construction, operate at maximum speed and complement the advantages of multi-bit read only memory cells.

DISCLOSURE OF THE INVENTION

A selected embodiment of the present invention is a read only memory (ROM) circuit which includes a word line and a plurality of storage transistors having the control terminals thereof connected to the word line. Each of the storage transistors has one of a plurality of threshold voltages wherein the threshold voltages correspond to respective predetermined data states. The circuit includes a plurality of reference transistors having the control terminals thereof connected to the word line. Each of the reference transistors is fabricated to have one of the threshold voltages. Circuit means are provided for driving each of the transistors to an initial condition. A step function generator is provided for generating a control signal which is applied to each of the transistors for sequentially driving a plurality of the transistors from the initial condition to a final condition in an order corresponding to the threshold voltages of the transistors. Circuitry is provided for determining the condition, initial or final, of the reference transistors when a selected one of the storage transistors is driven from the initial condition to the final condition. Further circuitry is provided for decoding the condition, initial or final, determined for the reference transistors when the selected storage transistor is driven to the final condition to generate an output signal corresponding to the data state of the selected storage transistor.

In accordance with a further aspect of the present invention the control signal is generated as a function in the change of conditions of the reference transistors. This feedback action provides maximum operating speed for the circuit while insuring that a complete transition is made for each of the threshold voltage levels.

BRIEF DESCRIPTION OF THE DRAWINGS

For a more complete understanding of the present invention and for further advantages thereof, reference will now be made to the following Detailed Description taken in conjunction with the accompanying Drawings in which.

DETAILED DESCRIPTION

Figure 1:
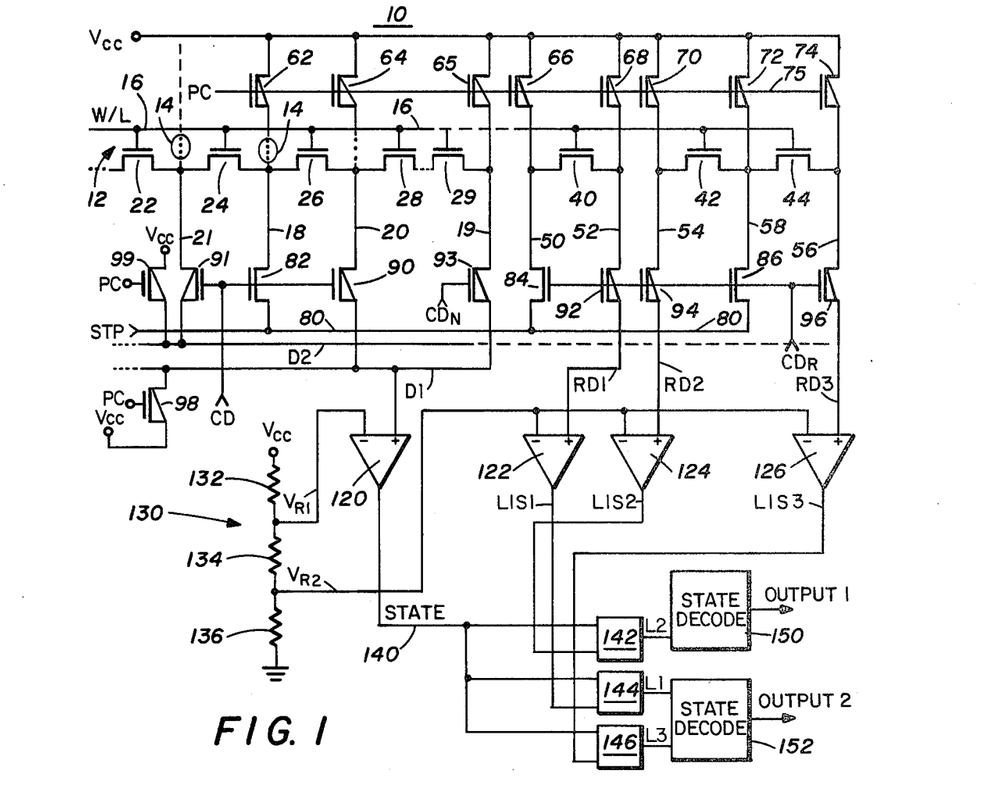
FIG. 1 is a schematic circuit diagram of the present multi-bit read only memory circuit.

Referring to FIG. 1, the read only memory (ROM) circuit of the present invention is illustrated and is generally identified by the numeral 10. Circuit 10 as illustrated in FIG. 1 is only a portion of an array of numerous such ROM memory circuits arranged in rows and columns in a conventional manner to form a read only memory. The ROM thereby formed using the present circuit 10 may be fabricated on a single semiconductor chip and is primarily intended for such fabrication using metal-oxide-semiconductor (MOS) technology.

When arranged in an array of memory cells, the memory cells are disposed in rows. One such row is generally identified by the numeral 12 in FIG. 1. The three dots identified by the numeral 14 indicate that there are a plurality of other such rows 12 within the read only memory; however, such rows are not shown for clarity of illustration. Associated with each row 12 is a word line 16 (W/L) utilized to enable all memory cells in the row 12 of the read only memory. The memory cells of the read only memory are disposed in columns and connected between column line 18 and bit lines 19, 20 and 21.

Connected to word line 16 are memory storage transistors 22, 24, 26, 28 and 29 each having gate, drain and source terminals and each forming a storage cell. Memory storage transistors 22, 24, 26, 28 and 29 are representative of numerous other such memory storage transistors connected to word line 16 and may total, for example, 256 memory cells. The gate terminals of memory storage transistors 22, 24, 26, 28 and 29 are each connected to word line 16.

For purposes of discussion herein, reference will be made to memory storage transistor 26 only, it being understood that each of the memory storage transistors disposed along word line 16 is similarly interconnected between a column line such as 18 and a bit such as line 20. The source terminal of memory storage transistor 26 is connected to column line 18 which provides a virtual ground voltage potential for memory storage transistor 26. The drain terminal of memory storage transistor 26 is connected to bit line 20 which transmits the data state from memory storage transistor 26. Column lines and bit lines alternate throughout the read only memory in which circuit 10 is utilized.

Each of memory storage transistors 22, 24, 26, 28 and 29 is capable of having any one of a plurality of ion implantations to establish threshold voltage levels of, for example, 0.5, 1.5, 3 and 8 volts. Each memory cell of the ROM therefore has the capability of storing multi-level or multi-bit data within a single memory cell. In the described embodiment each storage transistor stores two bits of data by having one of four possible threshold voltages.

Circuit 10 includes reference transistors 40, 42 and 44, each having gate, source and drain terminals. The reference transistors are utilized for determining the threshold voltage level stored within the memory cells formed by memory storage transistors 22, 24, 26, 28 and 29. Reference transistors 40, 42 and 44 are provided for each word line 16 of the ROM and are disposed at the end of word line 16 opposite the input end from which memory storage transistors 22, 24, 26 and 28 are located for the illustrated embodiment.

The gate terminals of reference transistors 40, 42 and 44 are each connected to word line 16. The source terminal of reference transistor 40 is connected to a column line 50 which provides a virtual ground potential for reference transistor 40. The drain terminal of reference transistor 40 is connected to a bit line 52 which provides a reference data 1 (RD 1) output signal from reference transistor 40. The drain terminal of reference transistor 42 is connected to a bit line 54 which generates an RD 2 output signal. The drain terminal of reference transistor 44 is connected to a bit line 56 which provides an RD 3 output signal. The source terminals of reference transistors 42 and 44 are interconnected to a common column line 58 which provides a virtual ground potential for reference transistors 42 and 44. The threshold voltage levels of reference transistors 40, 42 and 44 may be established at, for example, 0.5, 1.5 and 3 volts, respectively.

A voltage supply, $V_{cc}$, supplies a voltage to column line 18 through a precharge transistor 62; to bit line 20 through a precharge transistor 64; to column line 19 through a precharge transistor 65; to column line 50 through a precharge transistor 66; to bit line 52 through a precharge transistor 68; to bit line 54 through a precharge transistor 70; to column line 58 through a precharge transistor 72; and to bit line 56 through a precharge transistor 74. Precharge transistors 62, 64, 65, 66, 68, 70, 72 and 74, which are lightly depleted devices, receive a precharge (PC) signal through a line 75 for precharging the respective column and bit lines to a preselected voltage of $V_{cc}$.

The virtual ground voltage potential for column lines 18, 50 and 58 is generated by a step voltage function (STP) control signal applied via a control line 80. Column line 18 is pulled to the voltage level on control line 80 through actuation of a column select transistor 82. Transistor 82 is actuated by a column decode (CD) signal derived from decoding a memory address signal. After the CD signal goes from a low voltage to a high voltage, the virtual ground voltage potential of the step function control signal via control line 80 is applied to column line 18 for the selected memory storage transistor, such as memory storage transistor 26.

Also connected to control line 80 are column select transistors 84 and 86 for applying the virtual ground voltage potential supplied by the STP function/control signal to column lines 50 and 58 of reference transistors 40, 42 and 44.

The column decode, CD, signal is applied to a data transfer transistor 90 for passing data from memory storage transistor 26 to a common data signal line, D1. A data transfer transistor 93 passes data from bit line 19 to data line D1 if $CD_n$ goes to a high state. The CD signal is applied to data transfer transistor 91 for passing data from memory storage transistor 24 to a data signal line D2. A column decode signal $CD_R$ is applied to reference data transfer transistors 92, 94 and 96 for passing data from reference transistor 40 via bit line 52 to a reference data signal line (RD 1); for transferring data from reference transistor 42 via bit line 54 to a reference data signal line (RD 2); and from reference transistor 44 via bit line 56 to a reference data signal line (RD 3). The presence of the column decode, CD, signal causes data to be passed from a selected one of memory storage transistors of the ROM array to a data line. The $CD_R$ signal causes the transfer of data from all three reference transistors 40, 42 and 44 associated with the word line 16 of the selected memory storage transistor.

Data line D1 is precharged by a depletion transistor 98 which has the gate terminal thereof connected to receive the PC signal, the drain terminal thereof connected to $V_{cc}$ and the source terminal thereof connected to line D1. Data line D2 is precharged by a depletion transistor 99 which has the gate terminal thereof connected to receive the PC signal, the drain terminal thereof connected to $V_{cc}$ and the source terminal thereof connected to line D2.

The presence of the column decode signal, CD, for memory storage transistor 26 actuates data transfer transistor 90, such that transistor 26, when actuated, will apply an output along the data signal line, D1, to a differential comparator 120. The column decode signal $CD_R$ is applied to transistors 92, 94 and 96 which transmit output signals along reference data signal lines RD 1, RD 2 and RD 3 to differential comparators 122, 124 and 126. The input to comparator 120 and inputs to comparators 122, 124 and 126 from reference transistors 40, 42 and 44 are relatively slowly falling voltage signals depending upon the voltage threshold of the memory storage transistor and reference transistors actuated.

A first reference voltage for input to differential comparator 120 is generated by a voltage divider network, generally identified by the numeral 130. Voltage divider network 130 receives source voltage from voltage supply $V_{cc}$ which is applied to a resistor 132. Voltage divider network 130 further includes resistors 134 and 136 connected in series with resistor 132. The node between resistors 132 and 134 provides an output reference voltage, $V_{R1}$, which is applied to a first input terminal of comparator 120. The node formed between resistors 134 and 136 provides an output reference voltage, $V_{R2}$, which is applied to a first input terminal of each of the comparators 122, 124 and 126 associated with reference transistors 40, 42 and 44. Reference voltage 2, $V_{R2}$, is lower in value than reference voltage 1, $V_{R1}$, such that the trip point of comparators 122, 124 and 126 occurs later in time, for a falling voltage, than that of comparator 120. Voltage divider network 130 therefore provides two voltage levels for controlling and providing a delay between actuation of the comparator 120 associated with an actuated memory storage transistor and the actuation of comparators 122, 124 or 126 associated with reference transistors 40, 42 or 44. The importance of this delay will be further explained with reference to FIGS. 2 and 3.

The output of comparator 120 generates a STATE signal which is applied via line 140 to latch circuits 142, 144 and 146. The output of comparator 122 generates a latch initiate step 1 (LIS 1) signal which is applied to latch 144 and fed back to the STP generator described below. The output of comparator 124 generates a latch initiate step 2 (LIS 2) signal, which is applied to latch 142 and fed back to the STP generator. The output of comparator 126 generates the latch initiate step 3 (LIS 3) signal which is applied to latch 146. The STATE signal and LIS 1, LIS 2 and LIS 3 signals are signals varying in voltage from a high voltage to a low voltage. Latches 142, 144 and 146 are latched by the STATE signal going from a high to a low voltage when the latches have not been previously set.

The output L2 of latch 142 is applied to state decode circuitry 150. The outputs L1 and L3 respectively of latches 144 and 146 are applied to state decode circuitry 152. The outputs L1, L2 and L3 are the latched states of the corresponding latch input signals LIS1, LIS2 and LIS3. Each of the latches 142.144 and 146 is set by the first of either the input LIS signal going low or the STATE signal going low. The latches are reset at the start of each memory cycle.

State decode circuitry 150 and 152 are composed of combinational logic circuits for decoding the outputs L1, L2, and L3 of latches 142, 144 and 146 to generate a two bit code designated by the output 1 and output 2 signals, representing the voltage threshold level of a selected memory storage transistor being accessed. The state decoding for the four voltage threshold levels, performed by state decode circuitry 150 and 152 to generate the output 1 and output 2 signals, is shown in Table 1 below. The high (H) and low (L) conditions are shown for the initial conditions and each of four possible final conditions.

TABLE 1

| | | STATE | L1 | L2 | L3 | OUTPUT 1 | OUTPUT 2 |
|---|---|---|---|---|---|---|---|
| INITIAL CONDITION | | H | H | H | H | 1 | 2 |
| VOLTAGE THRESHOLD | | | | | | | |
| ST1 | (VT1) | L | H | H | H | L | L |
| ST2 | (VT2) | L | L | H | H | L | H |
| ST3 | (VT3) | L | L | L | H | H | H |
| ST4 | (VT4) | H | L | L | L | H | L |

Figure 2A:
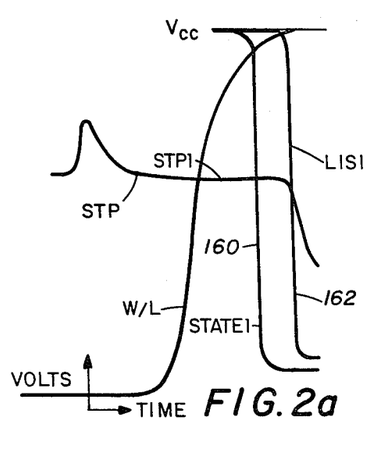
FIGS. 2a-2c show signal waveforms which illustrate the operation of the present read only memory circuit.
Figure 2B:
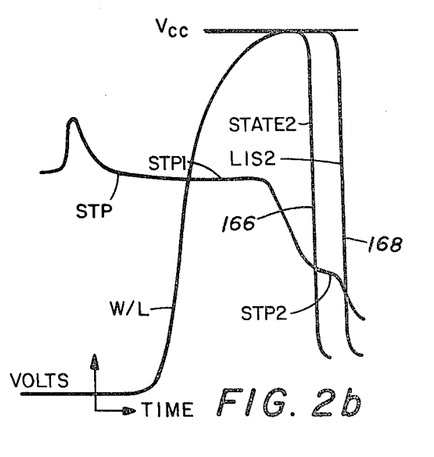
Figure 2C:
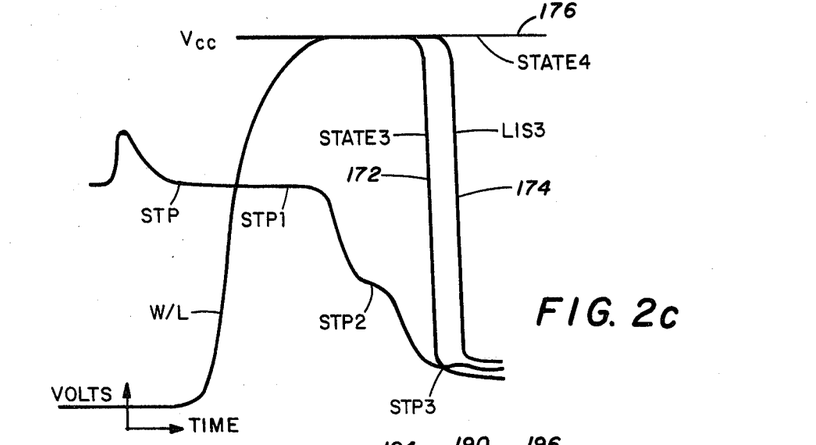

The operation of the ROM circuit 10 shown in FIG. 1 is now described in reference to FIGS. 2a, 2b and 2c. In each of these figures the step control signal is marked by the term STP. The step signal has three levels which are marked by STP1, STP2 and STP3. The step control signal serves as a virtual ground and is transmitted through line 80. A word line signal is designated by W/L and this signal is transmitted through line 16. The comparator 120 generates the STATE signal and is transmitted through line 140 to each of the latches 142, 144 and 146.

The embodiment of the present invention illustrated in FIGS. 1, 2a, 2b and 2c utilizes four threshold voltages for the storage transistors. The four threshold voltages are used such that two bits of data can be stored in each memory storage transistor. FIGS. 2a, 2b and 2c represent the operation of circuit 10 for respectively a memory storage transistor having a VT1, VT2 and a VT3 threshold value. These threshold values are progressively increasing and are, for example, 0.5, 1.5 and 3 volts respectively. The fourth state, VT4, is, for example, 8 volts such that the memory storage transistor cannot be turned on in a system which has a $V_{cc}$ of 5.0 volts.

In the sequence of operation of circuit 10 the first step comprises precharging the column and bit lines for each of the storage and reference transistors. This is accomplished by the PC signal which is applied to line 75 to activate the transistors 62, 64, 65, 66, 68, 70, 72 and 74. This PC signal serves to connect the supply $V_{cc}$ to the lines 18, 19, 20, 21, 50, 52, 54, 56 and 58. The PC signal then terminates leaving each of the column and bit lines precharged to a high voltage level.

The step control signal is transmitted through line 80 where it is selectively applied to the source terminal of one of the memory storage transistors by operation of a column select transistor. The signal CD is derived from the memory address applied to circuit 10. Only one of the column select transistors corresponding to word line 16 is activated during a memory cycle. If the memory address is directed to transistor 26, for example, a column decode signal applied to the gate terminals of transistors 82 and 90 will go high thereby rendering these transistors conductive. The activation of transistor 82 applies the control signal to the source terminal of transistor 26. This pulls the source terminal of transistor 26 to the STP1 level of the step control signal.

At the time the memory address is decoded the column decode signal $CD_R$ is generated whenever any one of the memory storage transistors along line 16 is selected. The signal $CD_R$ is applied to the gate terminals of transistors 84, 86, 92, 94 and 96. The activation of transistors 84 and 86 applies the step control signal to the source terminals of reference transistors 40, 42 and 44.

In the next step of operation of circuit 10 a word line signal is applied to the word line 16. The word line signal transitions from a low to a high voltage level and is generated in response to the memory address applied to circuit 10. The word line signal serves to select all of the memory storage transistors which are connected to the word line 16. However, only one of the storage transistors along line 16 will provide data to an output data line D1 due to the activation of only one of the column select and one of the data transfer transistors as controlled by the signals CD.

When any one of the storage or reference transistors is turned on the drain terminal of that transistor will be discharged from its precharged level and pulled to the level of the control signal applied to the source terminal of the selected transistor. This drop in voltage level in the bit line, such as line 20, is transmitted through a data transfer transistor, such as transistor 90, to a data line such as D1. The data line D1 is connected to the noninverting input of comparator 120. A similar discharge action occurs for the drain terminals of each of the reference transistors 40, 42 and 44. These falling voltage levels are transmitted as signals RD1, RD2 and RD3.

Circuit 10 illustrated in FIG. 1 utilizes a configuration which has two output data lines. These are data lines D1 and D2. These data lines are connected to alternate pairs of memory storage transistors.

The operation of circuit 10 will be described in reference to addressing the memory storage transistor 26 which provides its data through transistor 90 to data line D1. Each time the word line 16 is selected the reference transistors 40, 42 and 44 will be sequentially turned on to produce reference data signals, RD1, RD2 and RD3. The time relationship of the D1 signal to the RD1, RD2 and RD3 signals is utilized to determine the data state of the selected data storage transistor.

The step control signal applied through line 80 has three voltage levels. The STP1 level is essentially $V_{cc}-V_{T2}$, STP2 is essentially $V_{cc}-V_{T3}$ and STP3 is essentially ground.

When the STP1 level of the control signal is applied to line 80 the selected memory storage transistor, such as 26, will be turned on if transistor 26 is fabricated to have a $V_{T1}$ threshold voltage. At the STP1 level the gate-to-source voltage of transistor 26 is essentially equal to the threshold voltage $V_{T2}$. This is more than sufficient drive to turn on a $V_{T1}$ device, however, it is insufficient to affirmatively turn on a $V_{T2}$ device.

Each of the comparators 120, 122, 124 and 126 receives a reference voltage. A first reference voltage, $V_{R1}$, is provided to the comparator 120. A lower reference voltage, $V_{R2}$, is provided to the inverting inputs of comparators 122, 124 and 126. Each of the comparators has a normally high output level but the output is driven to a low state when the data input provided to the noninverting terminal becomes less than the corresponding reference voltage applied to the inverting terminal. The comparators 120, 122, 124 and 126 have high gain and therefore produce a sharp output transition. The output transition for comparator 120 is designated the STATE signal on line 140. The outputs of comparators 122, 124 and 126 are designated respectively as LIS 1, LIS 2 and LIS 3. The LIS signals together with the corresponding state signals are shown in FIGS. 2a, 2b and 2c.

Note that a lower reference voltage is applied to the reference comparators 122, 124 and 126. The lower reference voltage provides a time delay for the transition of the output from the comparator in reference to the data comparator 120 for similar threshold voltage transistors. Thus, when a selected memory storage transistor has the same threshold voltage as the reference transistor, the transition of the output of the reference comparator will occur at a later time from the transition of the output of the data comparator. This is shown in FIGS. 2a, 2b and 2c where the LIS signal is delayed from the corresponding STATE signal.

FIGS. 2a, 2b and 2c will now be described in detail for memory storage transistors having respective VT1, VT2 and VT3 threshold voltages. Referring to FIG. 2a for the example of transistor 26 having a reference threshold of VT1. Since the control step signal is at the STP1 level the transistor 26 will be turned on as soon as the word line reaches a sufficiently high voltage level. When transistor 26 turns on, the bit line 20 will be discharged thereby providing a falling input to the comparator 120. When this input falls to below the reference voltage $V_{R1}$ the STATE output signal of comparator 120, shown as line 160, will go from $V_{cc}$ to approximately ground. This is termed the STATE 1 signal which corresponds to a storage transistor having a VT1 threshold voltage.

For the described embodiment in circuit 10 the reference data transistors 40, 42 and 44 have respective threshold voltages of VT1, VT2 and VT3. Since transistor 40 receives the same word line and step control signal it likewise will be turned on under the conditions shown in FIG. 2a. However, it is possible that the signals applied to transistor 40 will be delayed from those applied to transistor 26 due to the resistance and compacitance of the word line 16 and the control signal line 80. The sensing circuit of the present invention, however, functions no matter what delay is encountered along the word line. Transistor 40 is typically fabricated at the end of word line 16 such that when transistor 40 is turned on it is assured that the word line 16 has been driven to a sufficiently high voltage. When transistor 40 is turned on the LIS 1 signal, shown as line 162 in FIG. 2a, transitions from a high to a low level. The transition of the LIS 1 signal, as described below, serves to cause the generation of the STP2 level of the step control signal.

Referring now to FIG. 2b for the case of the memory storage transistor 26 having a VT2 threshold. As the STP2 level is applied to the source terminal of transistor 26 its threshold voltage is exceeded thereby turning on the transistor and discharging the bit line 20. This discharge is detected by the data comparator 120 to produce the STATE 2 signal which is shown as line 166 in FIG. 2b. The reference transistor 42, which has a VT2 level is likewise turned on thereby generating the LIS 2 signal shown as line 168. Note that due to the different reference voltages provided to the comparators 120 and 124 the LIS 2 signal is time delayed from that of the STATE 2 signal.

Referring now to FIG. 2c there is shown the example of the storage transistor 26 having a VT3 threshold voltage. The step control signal generates the STP 3 level in response to the LIS 2 signal as described below. As the step control signal goes to essentially ground the transistor 26, with a VT3 threshold, will be turned on thereby discharging the bit line 20 and causing the generation of the STATE 3 signal which is shown as line 172 in FIG. 2c. The reference transistor 44 will likewise be turned on to produce a transition of the signal RD3 which in turn produces the signal LIS 3, shown as line 174. Again, note the time delay between the STATE 3 and LIS 3 signals.

For a memory storage transistor which has VT4 threshold voltage there will be no discharge of the bit line. Thus, the STATE 4 signal is a constant signal which stays at $V_{cc}$, as shown in FIG. 2c. There is no corresponding reference data transistor having a VT4 level.

Figures 3, 4:
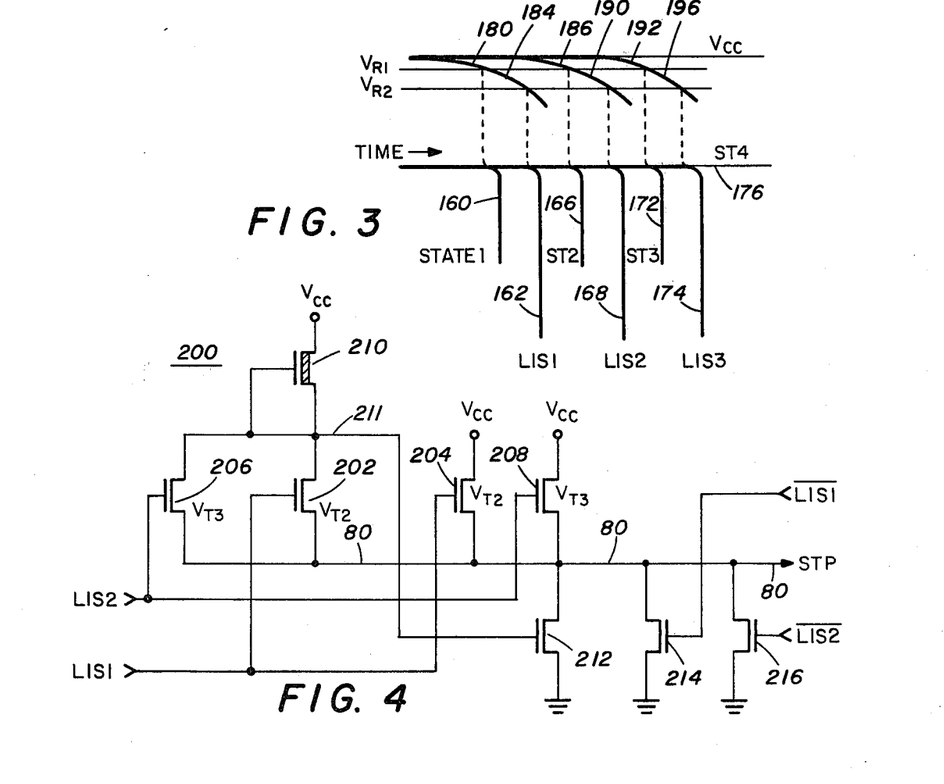
FIG. 3 shows further signal waveforms which illustrate the operation of the present read only memory circuit.
FIG. 4 is a schematic circuit diagram of a step function generator utilized with the present multi-bit read only memory circuit.

Referring now to FIG. 3 there is illustrated the relationship of the data signals, reference data signals, STATE signals and LIS signals. The data signals are shown as lines 180, 186 and 192 which correspond respectively to memory storage transistors having VT1, VT2 and VT3 threshold voltages. The data signal for a VT4 threshold voltage is constant at $V_{cc}$. The reference data signals from the reference transistors are shown as lines 184, 190 and 196. For this example there is assumed to be no delay along the word and control signal lines thus the transitions for the memory storage and reference transistors occur at the same time. This situation occurs when the memory storage transistor is adjacent to the reference transistor. Note that the $V_{R1}$ reference voltage exceeds the $V_{R2}$ reference voltage thus the outputs of the comparators occur at offset times. The time staggering of the transitions of the reference data outputs provides time windows into which the memory storage transistor outputs can fall. By use of the feedback circuitry described below the output of each of the reference data comparators does not fall until the storage transistor has been given a full opportunity to turn on. Thus, the circuit 10 operates at a very high speed while guaranteeing that no storage transistor that should turn on will be missed.

Since the reference and storage transistors are fabricated on the same integrated circuit chip there will be a uniformity between the corresponding threshold voltages despite the fact that processing variations may shift the absolute levels of the threshold voltages from one integrated circuit to another. Thus the circuit of the present invention provides a method for essentially overcoming fabrication flucuations while maintaining a maximum speed operating circuit.

Referring further to FIG. 1 during each memory access cycle the states of the reference data comparators 122, 124 and 126 will be progressively and sequentially changed. These changing states are input respectively to latches 142, 144 and 146. As each LIS signal goes from a high to a low voltage it latches the corresponding latch to have a low level output. The STATE signal from the data comparator 120 also serves to latch the LIS 1, LIS 2 and LIS 3 signals which have not gone to a low voltage level at the time that the memory storage transistor is turned on. Thus, the data state of the selected memory storage transistor is determined by the condition of the reference data transistors when the memory storage transistor is turned on or when all of the reference transistors are turned on.

The state decode circuits 150 and 152 are connected to the outputs of latches 142, 144 and 146 to generate an output signal comprising output 1 and output 2. These bi-level output signals correspond to the data state of the selected memory storage transistor. The logical operation of the latches and state decode circuits are described in Table 1.

Figure 6:
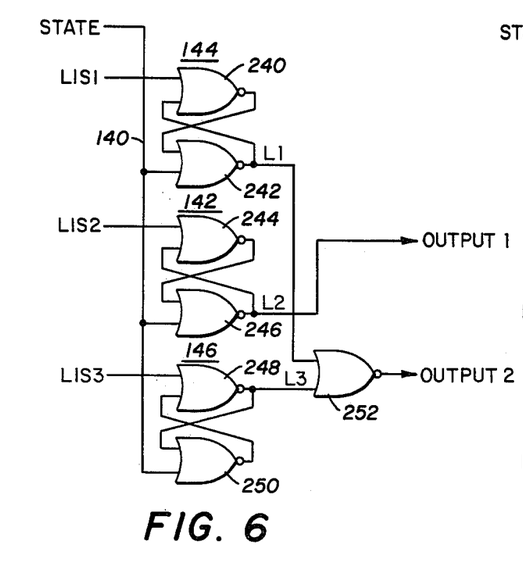
FIG. 6 is a logic diagram of latch and decode circuits shown in FIG. 1.
Figure 7:
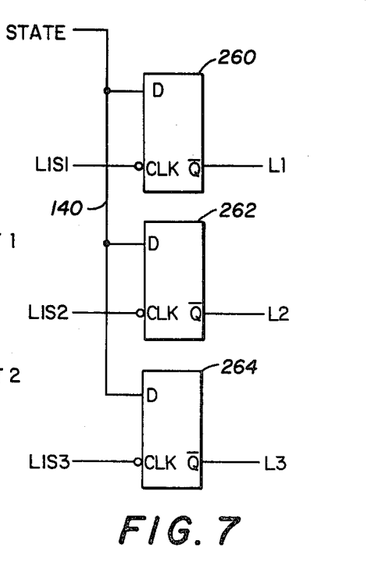
FIG. 7 is an alternate logic diagram of latch circuits shown in FIG. 1.

The latches and state decode circuits are described in further schematic detail in FIGS. 6 and 7.

For the case of the memory storage transistor having a VT4 threshold the STATE signal on line 140 will never go low to set the latches 142, 144 and 146. Each of the latches will be sequentially latched at a low voltage level as each of the LIS signals transitions from a high to a low level. A VT4 threshold thus corresponds to the condition in which all three latches are latched at a low voltage level.

The step control signal transmitted through line 80 and shown in FIGS. 2a, 2b and 2c, is generated by a step function generator circuit 200 illustrated in FIG. 4. The LIS 1 signal is input to the gate terminals of transistors 202 and 204 while the LIS 2 signal is input to the gate terminals of transistors 206 and 208. Transistors 202 and 204 fabricated to have a VT2 threshold voltage and the transistors 206 and 208 are fabricated to have a VT3 threshold voltage.

The source terminals of transistors 202, 204, 206 and 208 are connected to line 80 which serves as an output node to transmit the step control signal. The drain terminals of transistors 202 and 206 are connected to a node 211. Node 211 is further connected to the gate and source terminals of a heavily depleted transistor 210 which has the drain terminal thereof connected to the power supply $V_{cc}$.

Node 211 is further connected to the gate terminal of a transistor 212 which has the drain terminal connected to line 80 and the source terminal thereof grounded.

An inverted LIS 1 signal is input to the gate terminal of a transistor 214 which has the drain terminal connected to line 80 and the source terminal thereof grounded.

An inverted LIS 2 signal is input to the gate terminal of a transistor 216 which has the drain terminal connected to line 80 and the source terminal thereof grounded.

Figure 5:
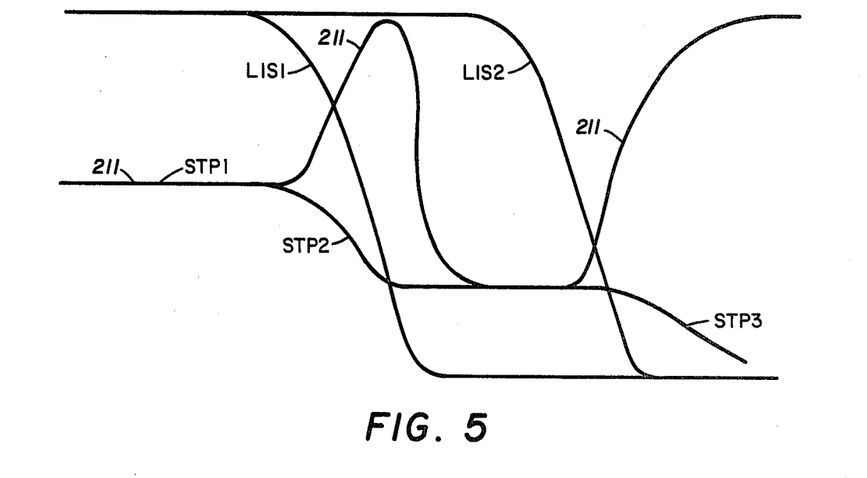
FIG. 5 shows signal waveforms which illustrate the operation of the step function generator.

Representative waveforms showing the operation of the step function generator circuit 200 are illustrated in FIG. 5. Operation of the step function generator circuit is now described in reference to FIGS. 4 and 5. In the initial condition the signals LIS 1 and LIS 2 are at a high voltage state. High voltage states applied to the gate terminals of transistors 204 and 208 serves to turn on transistor 204 since it has a lower threshold voltage. The line 80 is then clamped at essentially $V_{cc}$-VT2. The transistor 208 is not turned on under this condition since its gate-to-source voltage remains less than its threshold voltage.

Transistor 202 is likewise turned on which pulls node 211 to the same voltage state as line 80. Transistor 206 is not turned on since it has a greater threshold voltage than that of transistor 202. These conditions are shown in the waveforms illustrated in FIG. 5.

Transistor 212 is sized such that with the STP1 voltage at control node 211 applied to the gate terminal thereof it will draw a current from line 80 sufficient to discharge the selected column line thereby turning on the memory cell if it has the corresponding threshold voltage.

In the initial condition the $\overline{LIS\,1}$ and $\overline{LIS\,2}$ signals are low thereby turning off transistors 214 and 216.

Transistor 210 forms with transistor 202, a first inverter circuit which is tripped when the gate-to-source voltage of transistor 202 reaches VT2. Likewise, transistor 210 forms with transistor 206 a second inverter which is tripped when the gate-to-source voltage of transistor 206 reaches VT3. These trip points are established by the size of transistor 210 relative to transistor 202 and 206. When the LIS 1 signal transitions from a high to a low state the transistors 202 and 204 will be turned off. As transistor 202 is turned off the node 211 will be pulled high by transistor 210. As node 211 goes to a higher voltage state a greter drive is applied to the gate terminal of transistor 212. This serves to turn on transistor 212 harder which in turn pulls down the voltage at line 80. As the voltage at line 80 falls the transistor 206 will be turned on when the gate-to-source voltage of 206 reaches VT3 which will then pull down node 211 to the voltage of line 80. This action is illustrated in FIG. 5. Note that the voltage of node 211 rises from STP1 to essentially $V_{cc}$ and is then pulled down to the level of STP2. The line 80 is then clamped at the STP2 level due to the turn on of transistor 208. The STP2 voltage is essentially $V_{cc}$-VT3.

As the signal LIS 1 goes low its inverse goes high thereby turning on transistor 214. The transistor 214 is fabricated to be a size which provides a current drain from line 80. The size of transistor 214 is adjusted to provide a slight additional turn on voltage to the STP2 level of the step control signal. This is an adjustable parameter as determined by the size of the transistor 214.

When the LIS 2 signal transitions from a high to a low voltage state the transistor 206 is turned off thereby permitting transistor 210 to pull node 211 to a high voltage. The high voltage level at node 211 serves to turn on transistor 212 which pulls line 80 essentially to ground, which is the STP3 level of the step control signal. The ultimate voltage level of STP3 is determined by transistor 216 which is turned on when the LIS 2 signal goes to a high level. The transistor 216 further serves to pull node 80 to a low voltage state.

As can be seen in reference to FIGS. 4 and 5 the step function circuit 200 provides calibrated voltage step levels which are generated in response to two independent input signals, LIS 1 and LIS 2. The step function circuit 200 thus operates as a feedback circuit for providing the step control signal to the ROM circuit 10.

The step function circuit 200 is particularly significant in that it provides an accurate tracking of threshold voltages despite the phenomenon known as body effect. Body effect causes the threshold voltage of a transistor to vary as a function of the voltage at the source terminal. The circuit 200 provides voltage step levels which track with the threshold voltages of the memory storage transistors shown in FIG. 1. This tracking provides independence of the ROM circuit from fabrication variations.

Referring now to FIG. 6 there is shown a specific logic embodiment of the latch circuits 142, 144 and 146 together with the state decoders 150 and 152 illustrated in FIG. 1. The LIS 1 signal is provided as a first input to a NOR gate 240. The output of gate 240 is connected as a first input to a NOR gate 242. The output of gate 242 is also connected to provide a second input to gate 240. The STATE signal on line 140 provides a second input to gate 242.

The LIS 2 signal provides a first input to a NOR gate 244. The output of gate 244 is provided as a first input to a NOR gate 246. The output of gate 246 is connected to provide the second input to gate 244 and is connected to provide the output 1 signal. The STATE signal on line 140 provides a second input to gate 246.

The LIS 3 signal provides a first input to a NOR gate 248 which has the output thereof connected as a first input to a NOR gate 250 and further as an input to a NOR gate 252. The output of gate 250 is connected to provide a second input to gate 248. The STATE signal is provided as the second input to gate 250.

The NOR gate 252 has the output of gate 242 provided as the second input to produce the OUTPUT 2 signal.

The gates 240 and 242 together correspond to the latch 144. The gates 244 and 246 correspond to the latch 142 and the gates 248 and 250 correspond to the latch 146. The state decode circuit 150 in this particular embodiment is a straight through path. The state decode circuit 152 comprises the NOR gate 252.

Another detailed embodiment of the latches 142, 144 and 146 shown in FIG. 1 is illustrated in FIG. 7. The STATE signal on line 140 is provided to the D inputs of D-type flip-flops 260, 262 and 264. The LIS 1 signal is input to the clock terminal of flip-flop 260. The LIS 2 signal is input to the clock terminal of flip-flop 262. The LIS 3 signal is input to the clock terminal of flip-flop 264. A group of outputs L1, L2 and L3 are produced respectively at the $\overline{Q}$ outputs of flip-flops 260, 262 and 264. The logic signals L1, L2 and L3 are input to the STATE decode circuits 150 and 152 which in turn produce the output signals 1 and 2.

In summary, the ROM circuit of the present invention makes possible the utilization of multi-bit memory storage transistors which can be sensed and decoded with high speed and reliability.

Although one embodiment of the present invention has been illustrated in the accompanying drawings and described in the foregoing detailed description, it will be understood that the invention is not limited to the embodiment disclosed, but is capable of numerous rearrangements, modifications and substitutions without departing from the scope of the invention.

I claim:

1. A read only memory (ROM) circuit, comprising:
a word line;
a plurality of storage transistors having the control terminals thereof connected to said word line, each of said storage transistors having one of a plurality of threshold voltages wherein said threshold voltages correspond to respective predetermined data states;
a plurality of reference transistors having the control terminals thereof connected to said word line, each of said reference transistors having one of said threshold voltages;
means for driving each of said transistors to an initial condition;
means for generating a control signal which is applied to each of said transistors for sequentially driving a plurality of said transistors from said initial condition to a final condition in an order corresponding to the threshold voltages of said transistors;
means for determining the condition, initial or final, of said reference transistors when a selected one of said storage transistors is driven from said initial condition to said final condition; and
means for decoding the condition, initial or final, determined for said reference transistors when said selected storage transistor is driven to said final condition to generate an output signal corresponding to the data state of said selected storage transistor.

2. The ROM circuit recited in claim 1 including an additional storage transistor having a threshold sufficiently high such that said additional storage transistor cannot be driven to said final condition.

3. The ROM circuit recited in claim 1 wherein said means for generating a control signal functions in response to changes in condition of said reference transistors to generate said control signal having a plurality of sequential voltage steps.

4. The ROM circuit recited in claim 3 wherein each of said sequential voltage steps corresponds to one of said threshold voltages.

5. The ROM circuit recited in claim 1 including means for delaying the operation of said means for determining the state of said reference transistors relative to the change in condition of said selected storage transistor.

6. The ROM circuit recited in claim 1 wherein said reference transistors are positioned at one end of said word line.

7. A read only memory (ROM) circuit, comprising:
a word line;
a plurality of data storage transistors having the gate terminals thereof connected to said word line, each of said storage transistors having one of a plurality of threshold voltages wherein each said threshold voltage corresponds to a respective predetermined data state;

a plurality of reference transistors having the gate terminals thereof connected to said word line, each of said reference transistors fabricated to have a different one of said threshold voltages;

means for precharging the source and drain nodes of said transistors;

means for driving said word line from a first voltage state to a second voltage state;

means for applying a control signal to a first of the source and drain terminals of said transistors wherein said control signal comprises a series of voltage steps which sequentially increase the control voltage applied to turn on said transistors, said control signal causing said reference transistors to be sequentially turned on in order of the threshold voltages of said reference transistors;

means for determining the on/off states of said reference transistors when a selected one of said data storage transistors is turned on to produce an output signal corresponding to the predetermined data state for said selected storage transistor.

8. The ROM circuit recited in claim 7 wherein each of said data storage transistors are fabricated to have one of four threshold voltages thereby storing two data bits per storage transistor and wherein there are three of said reference transistors for each of said word lines, each one of said reference transistors on said word line having a different one of three of said four threshold voltages.

9. The ROM circuit recited in claim 7 wherein said step signal has three step voltages comprising a first step voltage having an amplitude to render conductive the ones of said transistors having a first of said four threshold voltages, a second voltage step having an amplitude to render conductive the ones of said transistors having the first and a second of said four threshold voltages, and a third voltage step having an amplitude to render conductive the ones of said transistors having the first, the second and a third of said four threshold voltages.

10. The ROM circuit recited in claim 7 wherein said means for determining comprises a group of three latches connected to receive signals which indicate respectively the states of said reference transistors, said latches set when said selected storage transistor is turned on or the corresponding reference transistor is turned on, and means for decoding the states of said latches when set to produce an output signal which indicates the condition of said selected storage transistor.

11. The ROM circuit recited in claim 7 wherein said means for generating a control signal functions to generate said control signal in response to the sequential turn-on of said reference transistors.

12. The ROM circuit recited in claim 7 including means for time delaying the indication of turn-on of each of said reference transistors in relation to a one of said storage transistors having the same threshold voltage.

13. A read only memory (ROM) circuit, comprising:
a word line;
a plurality of data storage transistors having the gate terminals thereof connected to said word line, each of said storage transistors having one of four threshold voltages wherein each of said threshold voltages corresponds to a data state;

a group of three reference transistors having the gate terminals thereof connected to said word line, each of said reference transistor having a different one of said threshold voltages;

circuit means for precharging the source and drain terminals for said transistors;

a control signal line for said transistors;

a data line corresponding to said storage transistors;

a plurality of column select transistors each connected between said control signal line and the source terminal for a respective one of said transistors for selectively connecting the corresponding transistor to said control signal line in response to a memory address signal;

a plurality of data transfer transistors each connected between said data line and the drain terminal for a respective one of said storage transistors for selectively connecting the corresponding storage transistor to said data line in response to a memory address signal;

a reference data transistor for each of said reference transistors, each reference data transistor having the drain terminal thereof connected to the drain terminal of a respective one of said reference transistors, the gate terminals of said reference data transistors connected to receive a memory address signal;

a first comparator having a first input thereof connected to said data line and a second input thereof connected to receive a first reference voltage;

a second comparator having a first input thereof connected to the source terminal of a first of said reference data transistors and a second input thereof connected to receive a second reference voltage;

a third comparator having a first terminal thereof connected to the source terminal of a second of said reference data transistors and a second terminal thereof connected to receive said second reference voltage;

a fourth comparator having a first input thereof connected to the source terminal of a third of said reference data transistors and a second input thereof connected to receive said second reference voltage;

a first latch which is set by the output signal from said first comparator or by the output signal from said second comparator to latch the state of the output signal received from said second comparator;

a second latch which is set by the output signal from said first comparator or by the output signal from said third comparator to latch the state of the output signal received from said third comparator;

a third latch which is set by the output signal from said first comparator or by the output signal received from said fourth comparator to latch the state of the output signal received from said fourth comparator;

a control signal circuit for generating a multi-step control signal which is transmitted through said control line to said transistors following receipt of a word line signal on said word line, said control signal having a first voltage step for rendering conductive the ones of said transistors having a first of said threshold voltages, a second voltage step for rendering conductive the ones of said transistors having the first and a second of said voltage thresholds and a third voltage step for rendering conductive the ones of said transistors have the first, the second and a third of said voltage thresholds, said second and third voltage steps generated in response to the output signals from said second and said third comparators; and circuit means connected to decode the output of said latches for generating an output signal which corresponds to the data state of an addressed one of said storage transistors.

14. A method of operation for a read only memory (ROM) circuit, comprising the steps of:

driving a plurality of data storage transistors to an initial condition wherein each of said storage transistors has one of a plurality of threshold voltages, each threshold voltage corresponding to a data state;

driving a plurality of reference transistors to said initial condition wherein each of said reference transistors has a different one of said threshold voltages;

applying a control signal to each of said transistors to sequentially drive a plurality of said transistors from said initial condition to a final condition in an order which is a function of the threshold voltages of said transistors;

determining the condition, initial or final, for each of said reference transistor when a selected one of said storage transistors is driven to said final condition; and generating an output signal corresponding to the data state of said selected storage transistor in response to the determined conditions for said reference transistors.

15. The method recited in claim 14 wherein said control signal is generated in response to a change of condition of said reference transistors.

16. The method recited in claim 14 wherein predetermined ones of said data storage transistors having a selected one of said threshold voltages are not driven to said final state by said control signal said predetermined ones of said data storage transistors decoded after all of said reference transistors have been driven to said final condition.

17. The method recited in claim 14 wherein said transistors in said initial condition are turned off and said transistors in said final condition are turned on.

18. The method recited in claim 14 wherein the step of applying a control signal to each of said transistors comprises applying a stepwise increasing gate to source voltage to said transistors wherein each voltage step of said control signal is a function of said threshold voltages.

19. The method recited in claim 14 including the step of delaying the indication of change in condition for each of said reference transistors.

20. A method of operation for a read only memory (ROM) comprising the steps of:

precharging the source and drain terminals for each of a plurality of data storage transistors and each of a group of reference transistors to drive each of said transistors to an off condition wherein each of said storage transistors has one of a plurality of threshold voltages, each threshold voltage corresponding to a data state, each of said reference transistors having a different one of said threshold voltages;

applying a word line signal through a common word line to the control terminals for each of said transistors;

applying a stepwise control signal to the source terminals of said transistors to sequentially increase the gate-to-source voltage of said transistors, each voltage step of said control signal being a function of said threshold voltages, said control signal sequentially driving a plurality of said transistors to an on condition in an order corresponding to said threshold voltages;

decoding an address signal to connect the drain terminal of a selected one of said storage transistors to a data line;

decoding said address signal to connect each of the drain terminals of said reference transistors to a respective reference data line;

comparing the voltage on said data line with a first reference voltage to produce a data state signal which is a function of the condition of the selected storage transistor;

comparing the voltages on each of said reference data lines with a second reference voltage to produce a reference data state signal for each of said reference transistors;

latching each of said reference data signals when the reference data signal makes a transition indicating that the corresponding reference transistor has been turned on;

latching each of said reference data signals upon a transition of said data state signal indicating that the selected one of said storage transistor has been turned on by said control signal; and decoding the latched reference data signals to generate an output signal corresponding to the data state of said selected storage transistor.

21. The method recited in claim 20 wherein said first and second reference voltages are different thereby time offsetting the transition of said data state signal and said reference data signal for corresponding one of said storage and reference transistors having the same threshold voltage.

22. The method recited in claim 20 wherein at least one of the voltage steps of said control signal are generated in response to a transition of one of said reference data state signals.

* * * * *